(12) United States Patent
Kurita et al.

(10) Patent No.: US 9,214,340 B2
(45) Date of Patent: Dec. 15, 2015

(54) APPARATUS AND METHOD OF FORMING AN INDIUM GALLIUM ZINC OXIDE LAYER

(71) Applicant: Applied Materials, Inc., Santa Clara, CA (US)

(72) Inventors: Shinichi Kurita, San Jose, CA (US); Srikanth V. Racherla, Fremont, CA (US); Suhail Anwar, Saratoga, CA (US)

(73) Assignee: APPLIED MATERIALS, INC., Santa, CA (US)

( * ) Notice: Subject to any disclaimer, the term of this patent is extended or adjusted under 35 U.S.C. 154(b) by 0 days.

(21) Appl. No.: 14/608,080

(22) Filed: Jan. 28, 2015

(65) Prior Publication Data

US 2015/0221508 A1    Aug. 6, 2015

Related U.S. Application Data

(60) Provisional application No. 61/936,208, filed on Feb. 5, 2014.

(51) Int. Cl.
| | |
|---|---|
| *H01L 21/00* | (2006.01) |
| *H01L 21/16* | (2006.01) |
| *H01L 21/20* | (2006.01) |
| *H01L 21/36* | (2006.01) |
| *H01L 21/02* | (2006.01) |
| *C23C 16/44* | (2006.01) |
| *C23C 16/505* | (2006.01) |
| *C23C 16/50* | (2006.01) |
| *C23C 16/52* | (2006.01) |
| *C23C 16/24* | (2006.01) |
| *H01L 29/786* | (2006.01) |

(52) U.S. Cl.
CPC .......... *H01L 21/02565* (2013.01); *C23C 16/24* (2013.01); *C23C 16/4412* (2013.01); *C23C 16/50* (2013.01); *C23C 16/505* (2013.01); *C23C 16/52* (2013.01); *H01L 21/0262* (2013.01); *H01L 21/02554* (2013.01); *H01L 29/7869* (2013.01)

(58) Field of Classification Search
CPC ...................................... H01L 29/7869
USPC ................... 438/104, 500, 502; 427/569, 576
See application file for complete search history.

(56) References Cited

U.S. PATENT DOCUMENTS

| | | | |
|---|---|---|---|
| 8,912,542 B2 | 12/2014 | Tseng | |
| 9,012,261 B2 | 4/2015 | Van Duren et al. | |
| 2004/0018304 A1* | 1/2004 | Chung | C23C 16/34 427/250 |
| 2004/0224504 A1* | 11/2004 | Gadgil | C23C 16/045 438/680 |
| 2005/0251990 A1* | 11/2005 | Choi | C23C 16/345 29/558 |
| 2013/0005081 A1 | 1/2013 | Chen et al. | |
| 2013/0337657 A1* | 12/2013 | Savas | H01L 21/02274 438/778 |

* cited by examiner

*Primary Examiner* — Karen Kusumakar
(74) *Attorney, Agent, or Firm* — Patterson & Sheridan, LLP

(57) ABSTRACT

The embodiments of the disclosure may generally provide a method and apparatus for forming thin film transistor device that includes an indium gallium zinc oxide (IGZO) layer using a multi-component precursor gas. The embodiments of the disclosure may provide a plasma enhanced chemical vapor deposition system configured to form an IGZO layer on large area substrates. However, it should be understood that the disclosure has utility in other system configurations such other types of chemical vapor deposition systems and any other system in which distributing a multi-component precursor gas to and within a process chamber is desired.

20 Claims, 6 Drawing Sheets

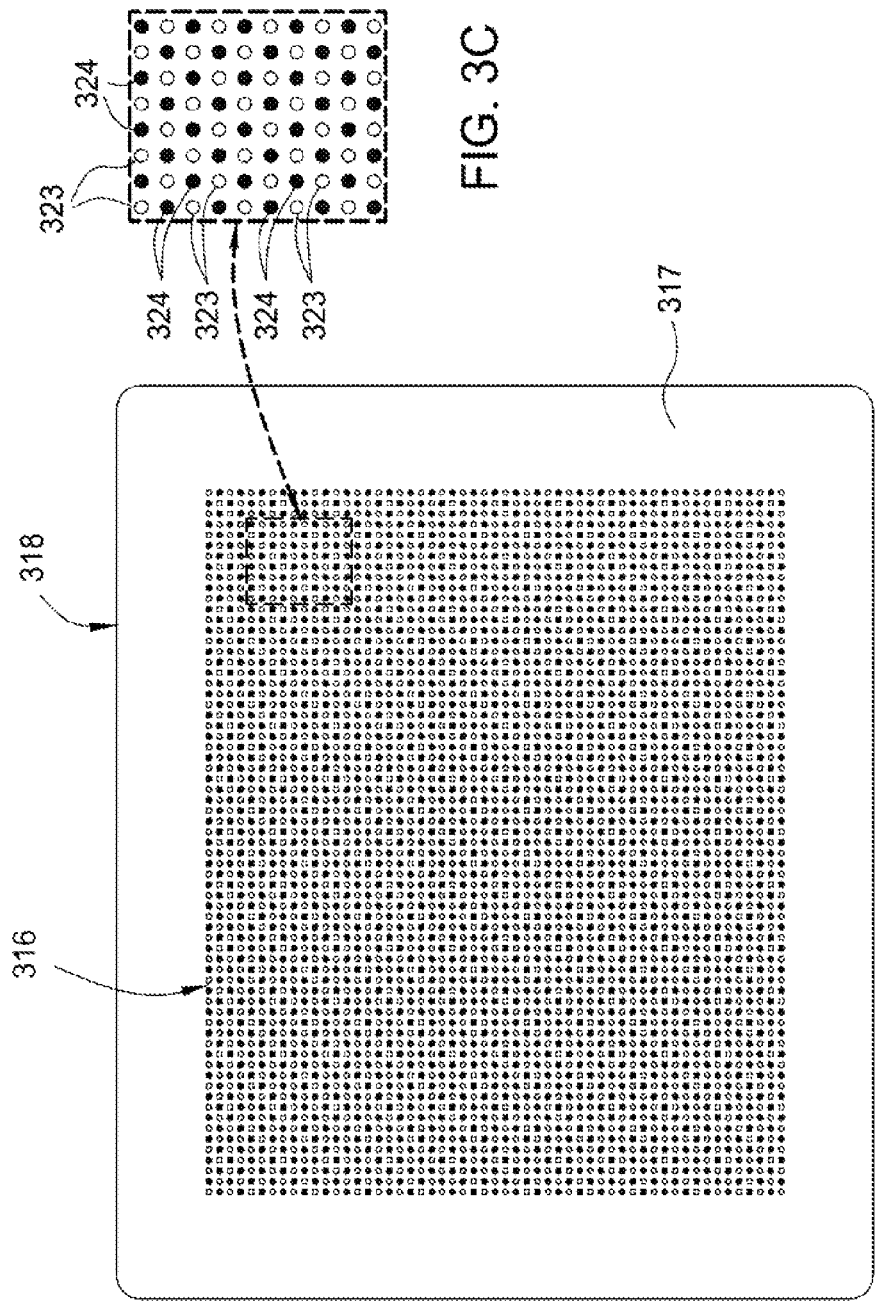

APPARATUS AND METHOD OF FORMING AN INDIUM GALLIUM ZINC OXIDE LAYER

CROSS-REFERENCE TO RELATED APPLICATIONS

This application claims benefit of U.S. Provisional Patent Application Ser. No. 61/936,208 (APPM/21161 L), filed Feb. 5, 2014, which is hereby incorporated herein by reference.

BACKGROUND OF THE DISCLOSURE

1. Field

Embodiments of the disclosure generally relate to a method and apparatus for forming a thin-film transistor device.

2. Description of the Background Art

Several trends in the evolution of flat screen displays are driving research and development efforts to improve the display performance or display manufacturability, such as larger screen sizes, smaller pixel sizes, LED-based pixels and reduced power consumption of the display. The latter three of these relate to thin film transistors (TFTs) which control the pixels within a display. Because indium gallium zinc oxide (IGZO) films can be made with a carrier mobility 20-50 times greater than that of amorphous silicon, TFTs that have IGZO channels can result in display devices, which are smaller, transparent and have reduced power consumption characteristics as compared to devices that contain an amorphous silicon containing channel layer.

A flat screen display typically contains a rectangular array of pixels, where the pixel is either a light switch (e.g., LCD) or a light source (e.g., OLED). In either case, most displays utilize one transistor for switching or controlling each pixel.

TFTs are a type of field effect transistor (FET). TFTs can be formed by depositing and lithographically patterning a series of layers that are formed over a substrate, such as a glass substrate. Semiconducting thin film materials, such as amorphous silicon or a metal-oxide semiconductor, typically form at least part of the semiconducting channel region of a TFT device, that is formed between a source and a drain. A gate is located in proximity to the channel, so that when a voltage is applied to the gate it can produce an electric field that affects the ability of carriers to move between the source and drain regions. By applying a voltage to a gate, a source-drain current can be turned on or turned off, thus forming a switch or an amplifier.

IGZO thin films have been deposited using methods, such as physical vapor deposition (PVD), atomic layer deposition (ALD), and chemical vapor deposition (CVD) processes. The other layers deposited in the manufacturing of a display TFT, such as metals, dielectrics or electrically insulating layers, may also utilize these deposition methods.

Due to the electrical and mechanical properties of an IGZO layer, process development efforts have shown that IGZO layers can help to reduce the pixel size, reduced TFT power consumption, and even form high resolution OLED products. However, the formation of an IGZO layer has its own set of challenges. First of all, PVD IGZO films are limited to stoichiometries of the formed PVD target material, which typically have a composition of either 5:1:1 or 1:1:1 (indium:gallium:zinc ratios), where the oxygen component of the IGZO film is introduced through reactive sputtering or a post-deposition treatment. This not only limits PVD IGZO process development, but limits a PVD deposited IGZO containing structure to a single layer having either a 5:1:1 composition or a 1:1:1 composition, or to a bi-layer structure, where one film has 5:1:1 composition and the other has a 1:1:1 composition. Finally, a PVD bi-layer process requires two separate PVD chambers, which is more expensive in production than a single-chamber process. In this disclosure, the words "layer" and "film" are used interchangeably; and the term "sublayer" is meant to denote a part of a layer.

Another problem with IGZO films is their susceptibility to environmental degradation, reported as the diffusion of hydrogen atoms into the IGZO active layer which affects transistor properties. Moving substrates between processing systems introduces exposure to atmospheric humidity, which can be absorbed into substrates and the deposited films. Native oxides can also form on materials exposed to air.

Therefore, there is a need for a method and apparatus for forming thin film transistor device that includes an indium gallium zinc oxide (IGZO) layer that solves the problems described above.

SUMMARY

Embodiments of the disclosure provided herein may provide a system for forming a multi-element containing film, comprising a gas distribution plate assembly comprising a first precursor plenum, a second precursor plenum and a heat exchanging channel formed in a body of the gas distribution plate assembly, a plurality of first gas conduits extending from the first precursor plenum through the heat exchanging channel, wherein each of the plurality of first gas conduits are in fluid communication with the first plenum and a processing region of a processing chamber, a plurality of second gas conduits extending from the second precursor plenum through the heat exchanging channel and the first precursor plenum, wherein each of the plurality of second gas conduits are in fluid communication with the second plenum and the processing region, an exhaust line that is disposed between and is in fluid communication with an exhaust pump and the processing region, a precursor line assembly that is in fluid communication with the first precursor plenum or the second precursor plenum, a vent line assembly that is in fluid communication with the exhaust line, and a plurality of precursor delivery systems. The precursor delivery systems each may comprise an ampoule having an inlet and an outlet, wherein an inner volume of the ampoule is configured to receive a precursor material and is in fluid communication with the inlet and the outlet, a vapor delivering source assembly that is configured to deliver a first gas to the inlet and inner volume of the ampoule, and a back pressure regulator that has an upstream side that is in fluid communication with the outlet of the ampoule and a downstream side that is fluid communication with either the precursor line assembly or the vent line assembly.

Embodiments of the disclosure may further provide a method of forming a multi-element containing film, comprising flowing a first multi-component precursor gas through a first plenum of a gas distribution plate assembly and into a processing region of a process chamber for a first period of time and a second period of time, wherein the first plenum is fluidly coupled to the processing region through a plurality of first gas conduits, and the first multi-component precursor gas is formed by mixing a first precursor gas and a second precursor gas in the first plenum or a precursor delivery line that is coupled to the first plenum, flowing a second multi-component precursor gas into a vent line assembly for a third period of time, wherein the second multi-component precursor gas is formed by mixing the first precursor gas and the second precursor gas, and the vent line assembly is fluidly coupled to an exhaust line that is disposed between and in fluid communication with the processing region and an exhaust pump, and introducing a heat exchanging fluid to a heat exchanging channel, wherein the plurality of first gas conduits extend through the heat exchanging channel, wherein flowing a second multi-component precursor gas into a vent line assembly for the third period of time is performed after flowing the first multi-component precursor gas through the first plenum for the first period of time and before flowing the first multi-component precursor gas through the first plenum for the second period of time.

BRIEF DESCRIPTION OF THE DRAWINGS

The teachings of the present disclosure can be readily understood by considering the following detailed description in conjunction with the accompanying drawings.

FIG. 3B is a bottom view of the perforated area and surface of the gas distribution plate assembly, according to one embodiment of the disclosure provided herein.

FIG. 3C is a close-up bottom view of a portion of the perforated area, according to one embodiment of the disclosure provided herein.

To facilitate understanding, identical reference numerals have been used, where possible, to designate identical elements that are common to the figures.

DETAILED DESCRIPTION

The embodiments of the disclosure may provide a method and apparatus for forming a thin film transistor (TFT) device that includes an indium gallium zinc oxide (IGZO) layer. The embodiments of the disclosure are illustratively described below in reference to a plasma enhanced chemical vapor deposition system configured to form an IGZO layer on large area substrates, such as a plasma enhanced chemical vapor deposition (PECVD) system, available from AKT, a division of Applied Materials, Inc., Santa Clara, Calif. However, it should be understood that the embodiments disclosed herein have utility in other system configurations, such as other types of chemical vapor deposition systems and other systems that are configured to distribute a multi-component precursor gas to and within a process chamber, including those systems configured to process round substrates.

Figure 1:
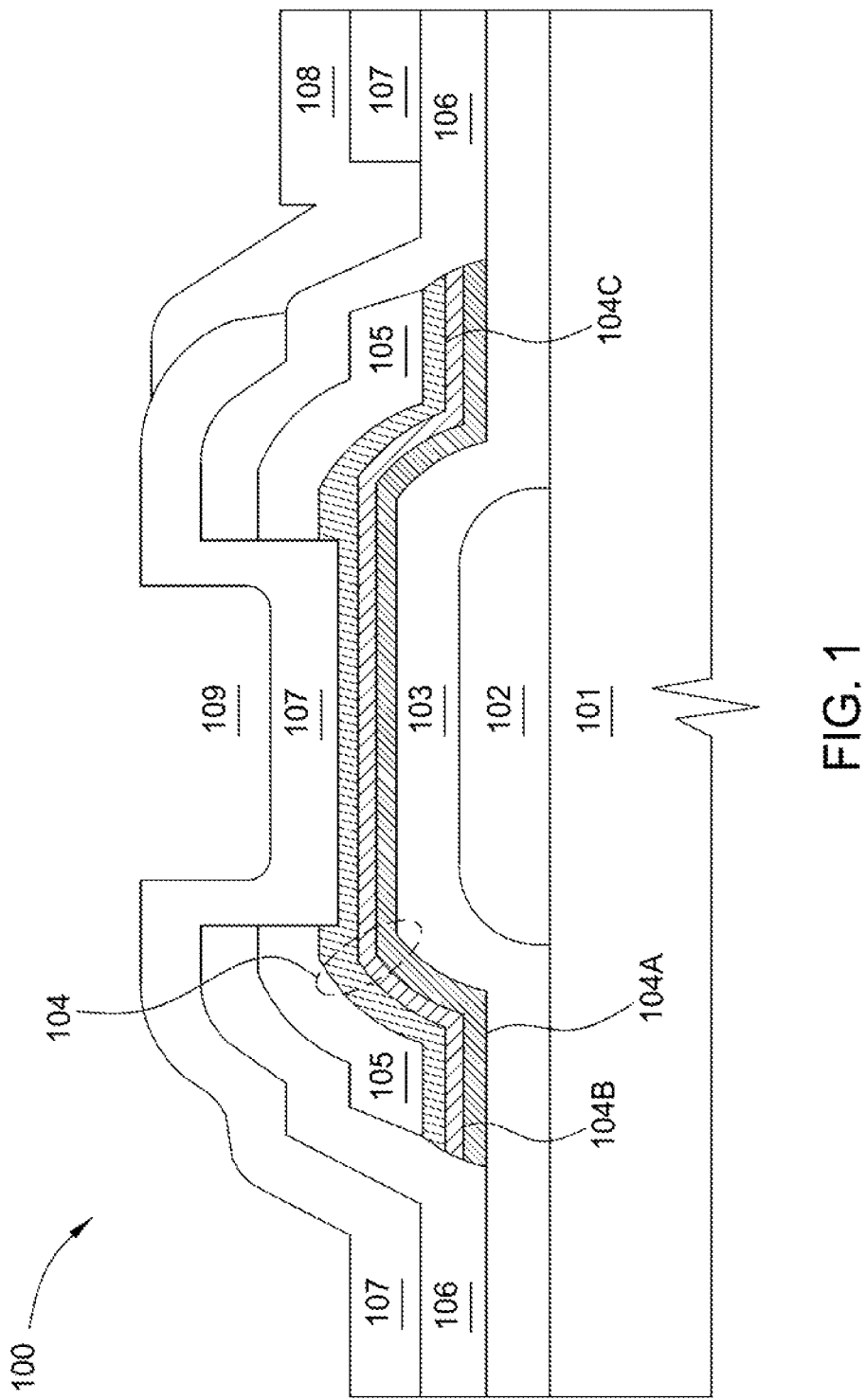
FIG. 1 depicts a cross-sectional schematic view of a bottom gate thin film transistor, according to an embodiment of the disclosure provided herein.

FIG. 1 illustrates cross-sectional schematic views of a thin film transistor structure 100. The substrate 101 may comprise a material that is essentially optically transparent in the visible spectrum, such as, for example, glass or clear plastic. The substrate may be of varying shapes or dimensions. Typically, for TFT applications, the substrate is a glass substrate with a surface area greater than about 500 mm$^2$. A gate electrode layer 102 is formed on the substrate 101. The gate electrode layer 102 comprises an electrically conductive layer that controls the movement of charge carriers within the TFT. The gate electrode layer 102 may comprise a metal such as, for example, aluminum (Al), tungsten (W), chromium (Cr), tantalum (Ta), or combinations thereof, among others. The gate electrode layer 102 may be formed using conventional deposition, lithography and etching techniques. Between the substrate 101 and the gate electrode layer 102, there may be an optional insulating material, for example, such as silicon dioxide (SiO$_2$) or silicon nitride (SiN), which may also be formed using an embodiment of a PECVD system described in this disclosure. The gate electrode layer 102 is then lithographically patterned and etched using conventional techniques to define the gate electrode.

A gate dielectric layer 103 is formed on the gate electrode layer 102. The gate dielectric layer 103 may be silicon dioxide (SiO$_2$), silicon oxynitride (SiON), or silicon nitride (SiN), deposited using an embodiment of a PECVD system described in herein. The gate dielectric layer 103 may be formed to a thickness in the range of about 100 Å to about 6000 Å. In some cases, the gate dielectric layer 103 can be formed using a high density plasma (HDP) type of PECVD (plasma enhanced chemical vapor deposition) process chamber, such as those manufactured and sold by Applied Materials for manufacturing TFT's on rectangular display substrates. The gate dielectric layer 103 may be formed by delivering a silicon containing precursor gas (e.g., silane, disilane) to a processing region of a process chamber to form a silicon containing layer on the surface of the substrate. The process chamber may be similar to, for example, process chamber 210 (FIG. 2) and/or process chamber 300 in FIG. 3, which are discussed below.

A bulk semiconductor layer 104 is formed on the gate dielectric layer 103. The bulk semiconductor layer 104 may comprise an IGZO active layer, which could be deposited using an embodiment of a PECVD system described herein. The bulk semiconductor layer 104 may be deposited to a thickness in the range of about 100 Å to about 3000 Å. The IGZO active layer may in some cases include three separate sub-layers 104A, 104B, and 104C. In one example, the stoichiometric properties of sub-layer 104A are tailored for optimizing gate dielectric interface-related electrical properties. In another simpler embodiment, the bulk semiconductor layer 104 includes only one sub-layer. In some embodiments, the bulk semiconductor layer 104 is composed of N sub-layers for optimizing TFT electrical performance. In yet another embodiment, bulk semiconductor layer 104 is composed of a large number N, such that individual sublayers are physically indistinguishable, but the resulting layer contains an observable gradient in material composition and/or properties. The bulk semiconductor layer 104 may also be a simple single layer that can be produced in a CVD process chamber by controlling gas flows and other process parameters as a function of time. An example of the process chamber is described below, and may be available from Applied Materials' AKT division.

A doped semiconductor layer 105 is formed on top of the bulk semiconductor layer 104. The doped semiconductor layer 105 may comprise an n-type (n+) or p-type (p+) doped IGZO layer, an IGZO layer with a different composition than the bulk semiconductor layer 104, a polycrystalline (polysilicon) or an amorphous silicon (α-Si), which could be deposited using an embodiment of a PECVD system described in this disclosure or other conventional methods known to the art. Doped semiconductor layer 105 may be deposited to a thickness within a range of about 100 Å to about 3000 Å. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surface. The conductive layer 106 may comprise a metal such as, for example, aluminum (Al), tungsten (W), molybdenum (Mo), chromium (Cr), tantalum (Ta), and combinations thereof, among others. The conductive layer 106 may be formed using conventional deposition techniques. Both the conductive layer 106 and the doped semiconductor layer 105 may be lithographically patterned to define source and drain contacts of the TFT. Afterwards, a passivation layer 107 may be deposited. Passivation layer 107 may conformally coat the exposed surfaces and features, such as feature 109. The passivation layer 107 is generally an insulator and may comprise, for example, silicon dioxide ($SiO_2$) or silicon nitride (SiN). The passivation layer 107 may be formed using, for example, PECVD or other conventional methods known to the art. The passivation layer 107 may be deposited to a thickness in the range of about 1000 Å to about 5000 Å. The passivation layer 107 is then lithographically patterned and etched using conventional techniques to open contact holes in the passivation layer 107.

A transparent conductor layer 108 is then deposited and patterned to make contacts with the conductive layer 106. The transparent conductor layer 108 comprises a material that is essentially optically transparent in the visible spectrum and is electrically conductive. Transparent conductor layer 108 may comprise, for example, indium tin oxide (ITO) or zinc oxide, among others. Patterning of the transparent conductor layer 108 is accomplished by conventional lithographical and etching techniques.

Processing System Components

Figure 2:
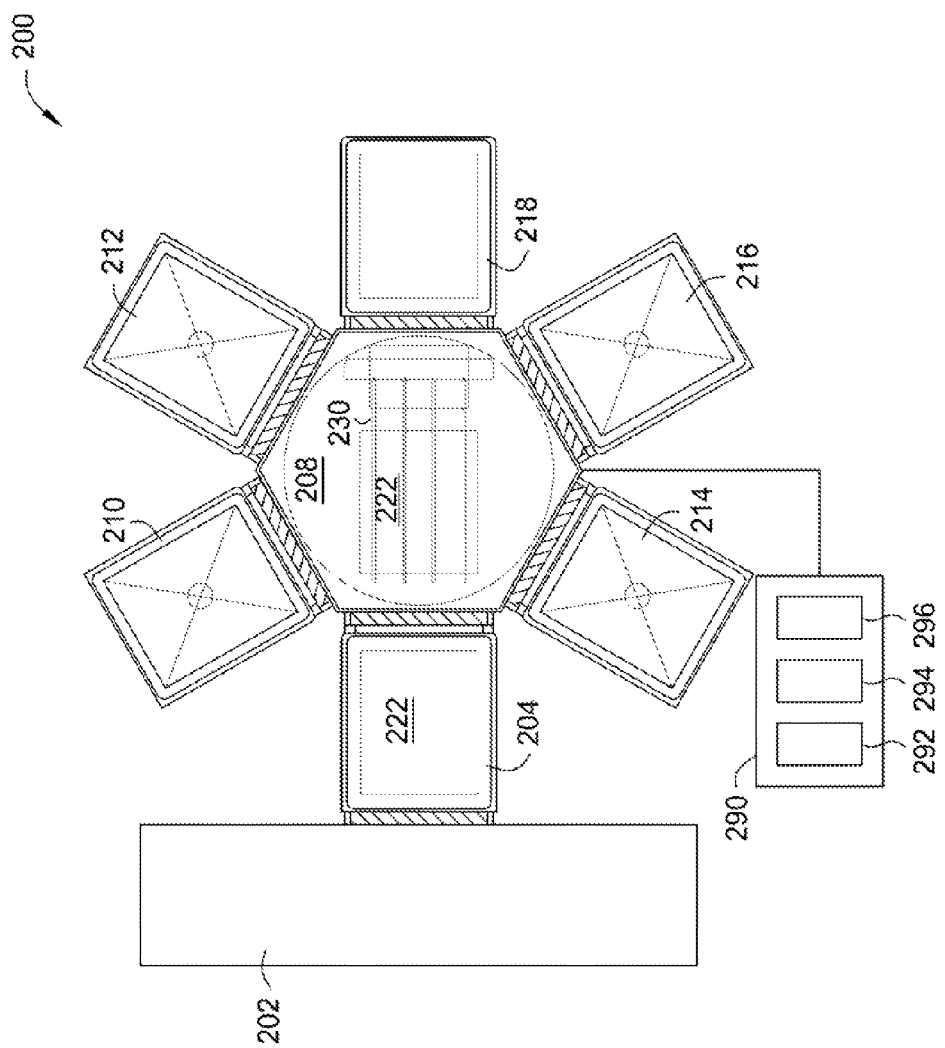
FIG. 2 is a plan view of an illustrative processing system having one process chambers disposed thereon, according to an embodiment of the disclosure provided herein.

FIG. 2 is a top plan view of a substrate processing system 200 suitable for forming one or more of the layers of the thin film transistor structure 100 discussed above using one or more of the various deposition techniques described herein on a substrate 222. The substrate processing system 200 typically includes a transfer chamber 208 coupled to a factory interface 202 via a load lock chamber 204 and a plurality of the process chambers 210, 212, 214, 216, 218 that are adapted to process the substrate 222.

The factory interface 202 generally includes one or more substrates stored therein or substrate storage cassettes. The substrate storage cassettes are typically removably disposed in a plurality of storage bays/compartments formed inside the factory interface 202. The factory interface 202 may also include an atmospheric robot, such as a dual blade atmospheric robot. The atmospheric robot is adapted to transfer one or more substrates between the one or more substrate storage cassettes and the load lock chamber 204. Typically, the factory interface 202 is maintained at or slightly above atmospheric pressure and the load lock chamber 204 is disposed to facilitate substrate transfer between a vacuum environment of the transfer chamber 208 and a generally ambient environment of the factory interface 202.

In one embodiment, the substrate processing system 200 is adapted to include various types of process chambers that are coupled to the transfer chamber 208. For example, the substrate processing system 200 may include one or more CVD chambers, PVD chambers, atomic layer deposition (ALD), preclean chambers, thermal processing chambers, substrate inspection chambers, or other useful process chambers.

The transfer chamber 208 is generally adapted to provide an environment in which substrates can be transferred between a plurality of process chambers 210, 212, 214, 216, 218 and one or more load lock chambers 204. The transfer chamber 208 is maintained at a vacuum condition to eliminate or minimize pressure differences between the transfer chamber 208 and the individual process chambers 210, 212, 214, 216, 218 after each substrate transfer. A transfer robot 230, such as a dual arm vacuum robot available from Applied Materials, Inc., can be coupled to and/or within the transfer chamber 208 for moving the substrate 222. Accordingly, the first transfer robot 230 is configured to be rotatably movable within the transfer chamber 208. In one configuration, the substrate 222 can be transferred within the substrate processing system 200 among one or more process chambers 210, 212, 214, 216, 218, and at least one of the process chambers is a PECVD chamber, such as described below in conjunction with FIG. 3A.

As shown in FIG. 2, the substrate 222 processed by the substrate processing system 200 can flow from the factory interface 202 to the load lock chamber 204 during a substrate fabrication sequence performed in the processing system 200. Further, the substrate 222 processed within the processing system 200 can be delivered through the various process chambers 210, 212, 214, 216, 218 during the substrate fabrication sequence, such as described herein. In one example, the substrate 222 is first processed within process chamber 210 and then processed within process chamber 212 during the substrate fabrication sequence, wherein the process(es) performed in the process chamber 210 include the formation of a silicon dioxide ($SiO_2$), silicon oxynitride (SiON), or silicon nitride (SiN) layer, and process performed in the process chamber 220 includes the formation of an IGZO layer on the substrate 222. The load lock chambers 204 may be a used as a buffer station for providing the substrate 222, which may allow the timely and sequential delivery of the substrates during one or more parts of the integrated substrate fabrication sequence. Preferably, the system includes a plurality of vacuum sealable valves that are used in various parts of the substrate processing system 200, such as slit valves, gate valves, slot valves, etc. For example, the first load lock chamber may include internal or external vacuum sealable valves for maintaining a low pressure level after the substrate is loaded into and from the atmospheric environment of the factory interface 202. In addition, the valves may be coupled to an internal or external actuator for opening and closing. In addition, the use of different types of pumps, such as a dry pump, a roughing pump, a turbo pump, and a cryogenic pump, among others, can be used to provide desirable vacuum pressure levels or staged vacuum levels as needed within one or more parts of the processing system 200.

In some configurations of the substrate processing system 200, a system controller 290 may be used to control one or more components found in the processing system 200. The system controller 290 is generally designed to facilitate the control and automation of the processing system 200 and typically includes a central processing unit (CPU) 292, memory 294, and support circuits (or I/O) 296. The CPU may be one of any form of computer processors that are used in industrial settings for controlling various system functions, substrate movement, chamber processes, and control support hardware (e.g., sensors, robots, motors, lamps, etc.), and monitor the processes performed in the system (e.g., substrate support temperature, power supply variables, chamber process time, I/O signals, etc.). The memory 294 is connected to the CPU 292, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 290 determines which tasks are performable on a substrate in one or more of the process chambers 210, 212, 214, 216, 218 and in the processing system 200. Preferably, the program is software readable by the system controller 290 that includes code to perform tasks relating to monitoring, execution and control of the movement, support, and/or positioning of a substrate along with the various process recipe tasks and various chamber process recipe steps being performed in the processing system 200.

Figure 3A:
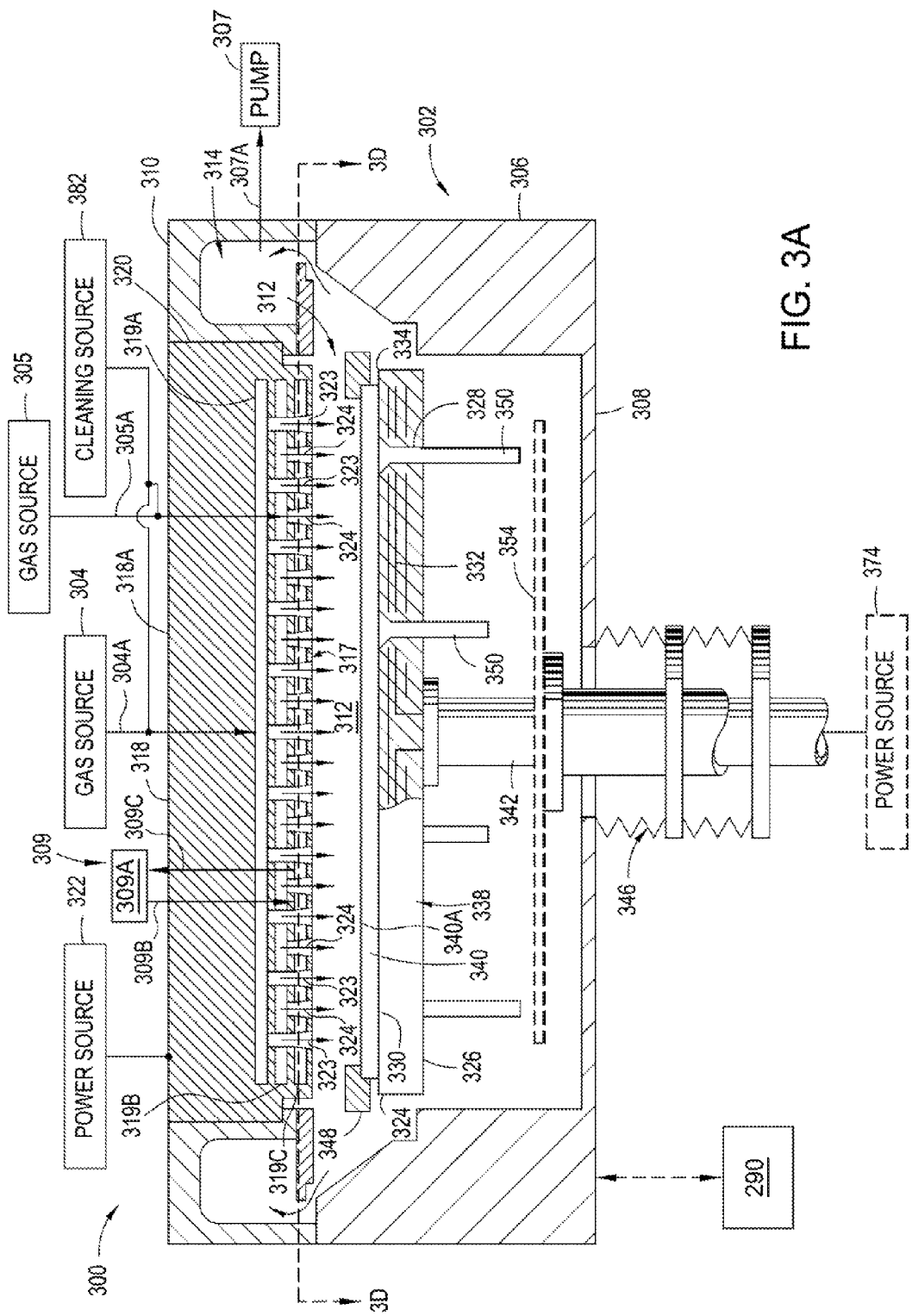
FIG. 3A is a schematic cross-sectional view of an illustrative process chamber, according to an embodiment of the disclosure provided herein.

FIG. 3A is a schematic cross-sectional view of one embodiment of a process chamber 300, such as a plasma enhanced chemical vapor deposition chamber that is available from Applied Materials, Inc. of Santa Clara, Calif. In one configuration, the process chamber 300 may be one of the one or more process chambers 210, 212, 214, 216, 218 disposed in the processing system 200, which is described above. The process chamber 300 generally includes a processing chamber body 302 coupled to a plurality of gas sources, such as gas source assembly 304 and gas source assembly 305. The processing chamber body 302 has walls 306 and a bottom 308 that partially define a processing region 312. The processing region 312 is typically accessed through a port (not shown) in the walls 306 that facilitate movement of a substrate 340 into and out of the processing chamber body 302. The walls 306 and bottom 308 are typically fabricated from a unitary block of aluminum or other material that is compatible with the processing environment. The walls 306 support a lid assembly 310 that contains a pumping plenum 314 that couples the processing region 312 to an exhaust line 307A that is coupled to an exhaust pump 307, which includes various vacuum generating pumping components (not shown). The exhaust pump 307 may include one or more types of pumps, such as a dry pump, a roughing pump, a turbo pump or a cryogenic pump that can be used to provide a desirable vacuum pressure level in the processing region 312 of the process chamber 300.

A temperature controlled substrate support assembly 338 is centrally disposed within the processing chamber body 302. The support assembly 338 supports a substrate 340 during processing. In one embodiment, the substrate support assembly 338 comprises an aluminum body that encapsulates at least one embedded heater 332. The heater 332 (e.g., resistive element) is disposed in the support assembly 338 and is coupled to an optional power source 374. The heater 332 and optional power source 374 can be used in combination to controllably heat the support assembly 338 and the substrate 340 positioned thereon to a predetermined temperature. Typically, in a CVD process, the heater 332 maintains the substrate 340 at a uniform temperature between about 150 to at least about 460 degrees Celsius, depending on the deposition processing parameters for the material being deposited.

Generally, the support assembly 338 has a lower side 326 and an upper side 334. The upper side 334 supports the substrate 340. The lower side 326 has a stem 342 coupled thereto. The stem 342 couples the support assembly 338 to a lift system (not shown) that moves the support assembly 338 between an elevated processing position (as shown) and a lowered position that facilitates substrate transfer to and from the processing chamber body 302. The stem 342 additionally provides a conduit for electrical and thermocouple leads between the support assembly 338 and other components of the chamber 300.

A bellows 346 is coupled between support assembly 338 (or the stem 342) and the bottom 308 of the processing chamber body 302. The bellows 346 provides a vacuum seal between the processing region 312 and the atmosphere outside the processing chamber body 302 while facilitating vertical movement of the support assembly 338.

The support assembly 338 is typically grounded, such that RF power supplied by a power source 322 to a gas distribution plate assembly 318 positioned between the lid assembly 310 and substrate support assembly 338 (or other electrode positioned within or near the lid assembly 310 of the chamber) may excite gases present in the processing region 312 between the support assembly 338 and the distribution plate assembly 318. The RF power from the power source 322 is generally selected commensurate with the size of the substrate to drive the chemical vapor deposition process.

The support assembly 338 additionally supports a circumscribing shadow frame 348. Generally, the shadow frame 348 prevents deposition at the edge of the substrate 340 and support assembly 338 so that the substrate does not stick to the support assembly 338. The support assembly 338 has a plurality of holes 328 disposed therethrough that accept a plurality of lift pins 350. The lift pins 350 are typically comprised of ceramic or anodized aluminum. The lift pins 350 may be actuated relative to the support assembly 338 by an optional lift plate 354 to project from the support surface 330, thereby placing the substrate in a spaced-apart relation to the support assembly 338.

The lid assembly 310 provides an upper boundary to the processing region 312. The lid assembly 310 typically can be removed or opened to service the processing chamber body 302. In one embodiment, the lid assembly 310 is fabricated from aluminum (Al). In some configurations, the pumping plenum 314, which is formed in the lid assembly 310, is utilized to channel gases and processing by-products uniformly from the processing region 312 and out of the processing chamber body 302.

The gas distribution plate assembly 318 is coupled to an interior side 320 of the lid assembly 310. The edge of the gas distribution plate assembly 318 is typically configured to substantially follow the profile of the substrate 340, for example, polygonal for large area flat panel substrates and circular for wafers. The gas distribution plate assembly 318 includes a perforated area 316 through which process and other gases supplied from the gas source assembly 304 and/or 305 are delivered to the processing region 312. The perforated area 316 of the gas distribution plate assembly 318 is configured to generally provide a uniform distribution of gases that pass through the gas distribution plate assembly 318 and into the processing chamber body 302.

The gas distribution plate assembly 318 also typically includes a plurality of gas plenums, such as precursor plenum 319A and precursor plenum 319B, and a heat exchanging channel 319C that are formed within the body 318A of the gas distribution plate assembly 318. The precursor plenum 319A and precursor plenum 319B are each in fluid communication with the processing region 312 by use of a plurality of gas distribution conduits, such as gas conduits 323 and 324. In some configurations, the gas conduits 323 and 324 include a plurality of tubes or similar structures that are adapted to separately deliver the gases flowing through each of the precursor plenums 319A, 319B to the processing region 312.

Figure 4:
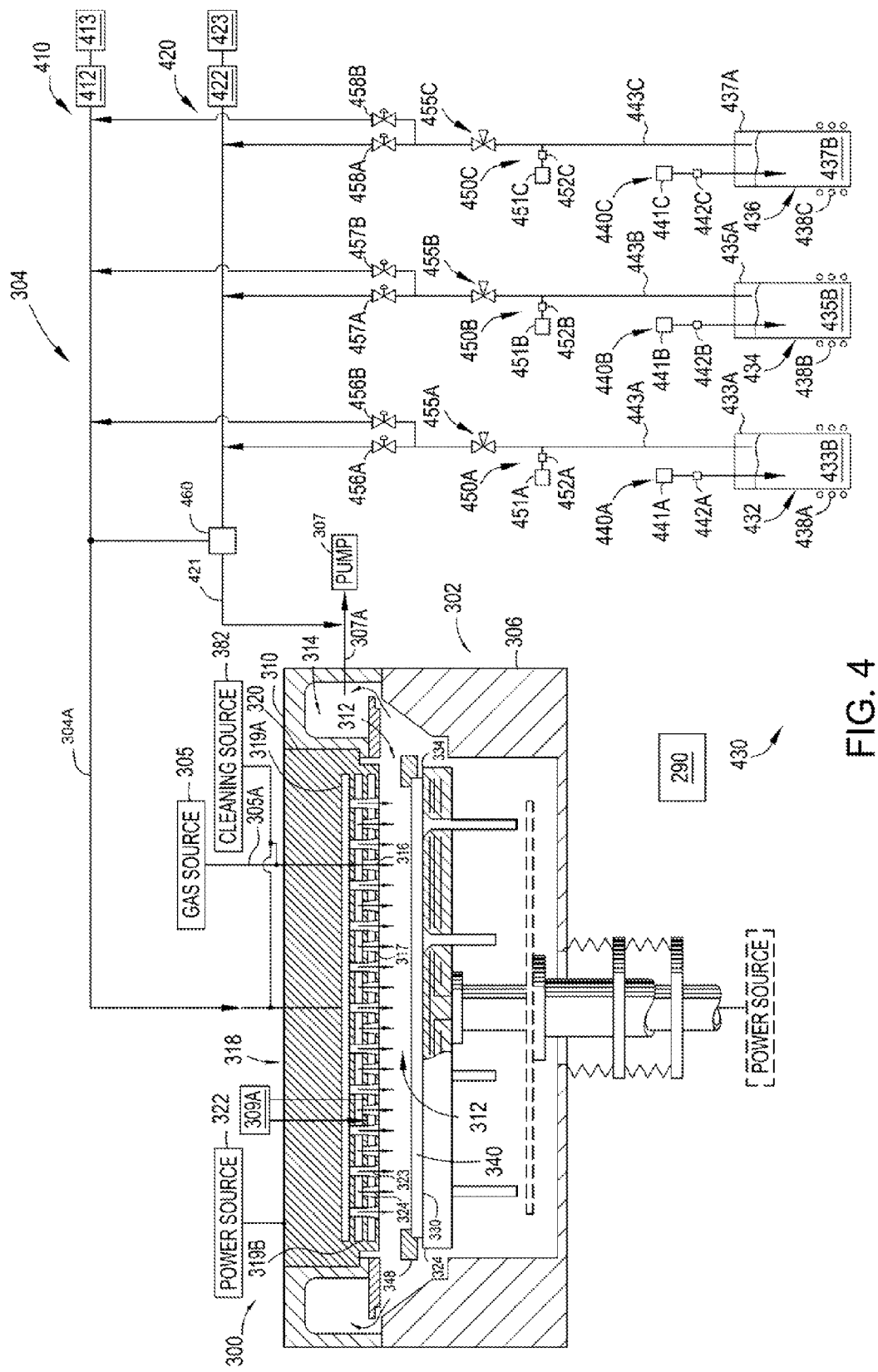
FIG. 4 is a schematic illustration of one configuration of the gas source assembly, according to an embodiment of the disclosure provided herein.

The gas source assemblies 304 and 305 are generally separately coupled to the gas the precursor plenums 319A and 319B, respectively, to provide one or more gases to the processing region 312 during processing. The gas source assemblies 304 and 305 may each include multiple sources that are adapted to deliver different types of gases to the processing region 312. The gas source assemblies 304 and 305 are each coupled to inlet lines 304A and 305A, respectively, and are, for example, adapted to deliver a precursor gas and a carrier gas through the inlet lines 304A and 305A into the processing region 312. Each inlet line 304A and 305A may comprise a plurality of separate gas lines that are in fluid communication with the precursor plenum 319A and precursor plenum 319B, respectively. Depending on the process(es) being run in the chamber 300, some of the gas source assemblies 304 and 305 may include a vapor generation source that is used to form a precursor gas that is used to form a layer on a surface of the substrate disposed in the processing region 312. The vapor may then be mixed with a carrier gas such as hydrogen ($H_2$), nitrogen ($N_2$), helium (He) and/or argon (Ar) prior to delivery to the process chamber 300, which is further discussed below. Furthermore, the inlet lines 304A and 305A may include shut-off valves, mass flow controllers or other types of fluid controlling devices that can monitor, regulate and/or shut off the flow of gas in each line. While not intending to be limiting as to the scope of the disclosure described herein, in some configurations, the gas source assembly 304 is configured to deliver a multi-component precursor gas, as discussed further below, and the gas source assembly 305 is configured to provide a second precursor gas. In one example, the gas source assembly 305 is configured to provide a second precursor gas that comprises an oxygen containing gas, such as ozone gas ($O_3$), oxygen ($O_2$), oxygen containing radicals, oxygen containing ions or other similar gases that may be delivered from a gas source or generated by a remote plasma source (RPS), a UV source or other useful device. An example of gas flow schematic is illustrated in FIG. 4, which is discussed in more detail below.

Therefore, during operation a first process gas may flow through inlet line 304A, from the gas source assembly 304, into the precursor plenum 319A and then into gas conduits 323 and then into the processing region 312. Separately, a second process gas may flow from the gas source assembly 305 through the inlet line 305A into the precursor plenum 319B and then into gas conduits 324 and then into the processing region 312. The precursor plenum 319A is generally not in fluid communication with the precursor plenum 319B, so that the first process gas and the second process gas remain isolated until they are injected into the processing region 312 located within the processing chamber body 302. The first process gas and/or second process gas may comprise one or more precursor gases or other process gases, including carrier gases and dopant gases, to carry out desired processes within the processing region 312. For example, the first process gas and second process gas may contain one or more precursors for deposition of a material on substrates 340 positioned on the support assembly 338.

FIG. 3B is a bottom view of the perforated area 316 of the surface 317 of the gas distribution plate assembly 318, according to one embodiment of the disclosure provided herein. FIG. 3C is a close-up bottom view of a portion of the perforated area 316, according to one embodiment of the disclosure provided herein. In one configuration, as shown in FIGS. 3B and 3C, gas conduits 323 and 324 are formed in an interleaved pattern so that the precursor gases provided through the gas conduits 323 and the precursor gases provided through the gas conduits 324 are uniformly mixed and uniformly delivered from the perforated area 316 to the surface 340A of the substrate 340. In one example, the gas conduits 323 and 324 are formed in a square or rectangular pattern across the perforated area 316. The components within the body 318A of the gas distribution plate assembly 318 are typically fabricated from stainless steel, aluminum (Al), anodized aluminum, nickel (Ni) or other RF conductive material. The body 318A of the gas distribution plate assembly 318 may be formed by casting, brazing, forging, welding, machining, hot iso-statically pressing and/or sintering plates, sheet, tubes and/or other useful material to form the complete structure. The gas distribution plate assembly 318 generally has a thickness that maintains a sufficient flatness so as not to adversely affect the processes performed within the process chamber 300. The gas distribution plate assembly 318 could be circular for semiconductor wafer manufacturing or polygonal, such as rectangular, for flat panel display manufacturing.

The heat exchanging channel 319C is coupled to a heat exchanging system 309 to control the temperature of the various surfaces of the gas distribution plate assembly 318. The heat exchanging system 309 comprises a heat exchanger 309A that is coupled to the one or more heat exchanging channels 319C formed in the gas distribution plate assembly 318 via an inlet conduit 309B and an outlet conduit 309C. The heat exchanging channel 319C through which a heat exchanging fluid flows is used to help regulate the temperature of the gas distribution plate assembly 318.

The heat exchanging channel 319C is disposed between the precursor plenum 319B and the surface 317 of the gas distribution plate assembly 318. The heat exchanging channel 319C encircles the gas conduits 323 and 324. Thus, the heat exchanging fluid can flow around and cool the gas or vapor flowing through the gas conduits 323, 324 while the vapor flows into processing region 312.

The positioning of a heat exchanging channel 319C within the gas distribution plate assembly 318 provides control of the temperature of various showerhead assembly components or features, such as the gas conduits 323 and 324 and the showerhead face (e.g., surface 317). Control of the temperature of the showerhead assembly is desirable to reduce or eliminate the formation of condensates on the gas distribution plate assembly 318 and help control the temperature of the substrate during processing. Control of the temperature of the various components in the showerhead assembly is also desirable to reduce gas phase particle formation and to prevent the production of undesirable precursor reactant products, which may adversely affect the composition of the film deposited on the substrates 340. The showerhead temperature may be measured by one or more thermocouples (not shown) or other temperature sensors (not shown) disposed in proximity to the showerhead face, heat exchanging channel 319C, and/or wall 306. Additionally or alternatively, one or more thermocouples or other temperature sensors may be disposed in proximity to the inlet conduit 309B and/or the outlet conduit 309C. The temperature data measured by the one or more thermocouples or other temperature sensors is sent to the system controller 290 which may adjust the heat exchanging fluid temperature and flow rate to maintain the showerhead temperature within a predetermined range. The showerhead temperature is generally maintained at about 50 degrees Celsius to about 350 degrees Celsius, but may also be maintained at a temperature of greater than 350 degrees Celsius, if desired.

Figure 3D:
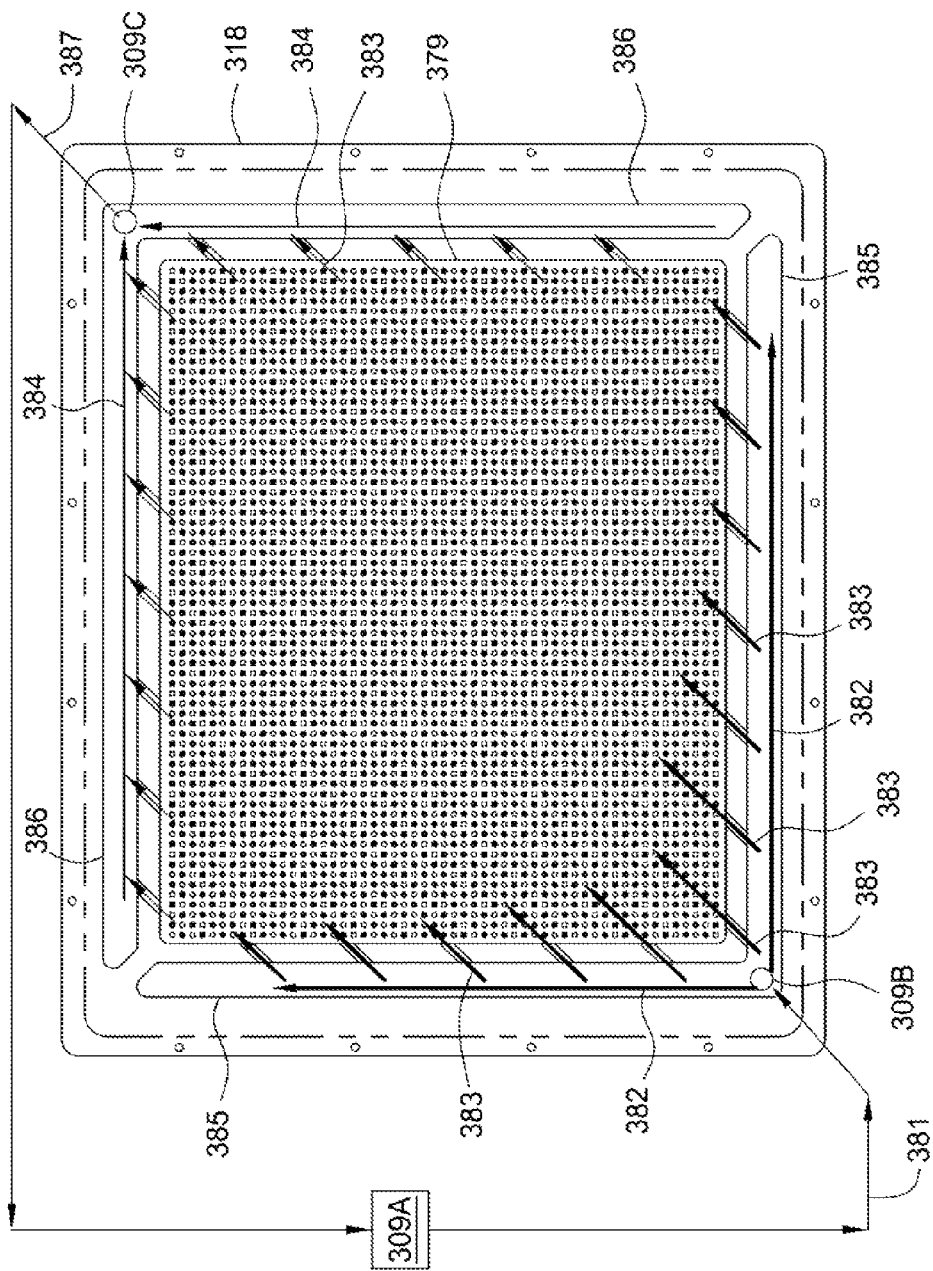
FIG. 3D is a cross-sectional view of a portion of the gas distribution plate assembly cut along a section line 3D-3D shown in FIG. 3A that extends through a heat exchanging channel, according to an embodiment of the disclosure provided herein.

FIG. 3D is a cross-sectional view of a portion of the gas distribution plate assembly 318 that is cut along a section line 3D-3D (see FIG. 3A), which extends through the heat exchanging channel 319C. In some embodiments, as shown in FIG. 3D, the gas distribution plate assembly 318 is square or rectangular shaped, and the inlet conduit 309B and outlet conduit 309C are positioned at opposing corners of the gas distribution plate assembly 318 to assure that the fluid motion or movement through the heat exchanging channels 319C is uniformly distributed. In this configuration, the heat exchanger 309A is configured to deliver a cooled heat exchanging fluid through the inlet conduit 309B formed in the gas distribution plate assembly 318 and into a conduit 385 formed in the heat exchanging channel 319C, as shown by the flow 381. The flow 381 of the cooled heat exchanging fluid is then delivered into the central region 379 of the heat exchanging channel 319C. The flow of heat exchanging fluid then flows within a space that surrounds the gas conduits 323 and 324, which are disposed in the central region 379, as shown by the flow 383. The heat exchanging fluid then flows from the central region 379, through the outlet conduit 386 and then into the outlet conduit 309C and then back to the heat exchanger 309A, as illustrated by the flows 383, 384 and 387.

The flow rate of the heat exchanging fluid may be adjusted to help control the temperature of the gas distribution plate assembly 318. Additionally, the thickness of the walls surrounding the heat exchanging channel 319C may be designed to facilitate temperature regulation of various showerhead surfaces. Suitable heat exchanging fluids include water, water-based ethylene glycol mixtures, a perfluoropolyether (e.g., GALDEN® fluid), oil-based thermal transfer fluids, or liquid metals such as gallium or gallium alloy. The heat exchanging fluid can be maintained at a temperature of 20 degrees Celsius or greater, depending on process requirements. For example, the heat exchanging fluid can be maintained at a temperature within a range from about 20 degrees Celsius to about 120 degrees, or within a range of about 100 degrees Celsius to about 350 degrees Celsius. The heat exchanging fluid may also be heated above its boiling point so that the gas distribution plate assembly 318 may be maintained at higher temperatures using readily available heat exchanging fluids.

The lid assembly 310 typically also includes a cleaning source 382 that may provide a cleaning agent, or cleaning gas, such as dissociated halogen gas (e.g., chlorine ($Cl_2$)), that is introduced into the processing chamber body 302 to remove deposition by-products and films from process chamber hardware, including the gas distribution plate assembly 318. In some embodiments, the processing sequence performed in the processing chamber includes delivering a cleaning gas to the processing region 312 of the process chamber during a chamber idle or chamber maintenance period to clean one or more components disposed therein. In some cases, the cleaning gas is delivered to the processing region 312 through the precursor plenum 319A and/or the precursor plenum 319B from the cleaning source 382. In some configurations, the cleaning source 382 includes a remote plasma source that is configured to excite the cleaning gas to form ions or radicals that are used to promote the activity of the cleaning gas during the cleaning process. In one example, the cleaning source 382 is configured to provide a cleaning gas that comprises a halogen containing gas, such as chlorine ($Cl_2$), fluorine ($F_2$), bromine ($Br_2$), Iodine ($I_2$), other gas containing one of these elements, or other similar gas that may be delivered from a gas source in the cleaning source 382 or gas radicals generated by a remote plasma source (RPS), a UV source or other useful device. In one example, the cleaning process includes generating a plasma containing a cleaning gas that comprises chlorine ($Cl_2$), and then delivering the cleaning gas to the processing region 312 of the process chamber during a period of time when the cleaning process is being performed.

Precursor Delivery System(s) and Delivery Method

The process of forming one or more layers containing multiple chemical elements on a surface of a substrate by use of a chemical vapor deposition process can be very complex. The deposition process can be especially complex when the composition of the deposited one or more layers is adjusted by the adjusting the composition of a multi-component precursor gas during different stages of the deposition process. As briefly discussed above, chemical vapor deposition processes generally require the formation of precursor gases by the generation of a vapor from a solid or liquid precursor source material that is disposed in an ampoule that is positioned within either of the gas source assemblies 304 or 305. Since the solid or liquid precursor material found in the ampoules typically each have a differing vapor and/or sublimation rate at a given temperature and pressure maintained within the inner volume of the ampoules, the desired composition of a multi-component precursor gases, and thus composition of the deposited film, is hard to control. Also, controlling the repeatable delivery of a multi-component precursor gas for each substrate processed in a process chamber, due to common problems that are often created by the starting and stopping of the flows of the multiple precursor gases, is also a challenge. These common problems are often created from "gas bursts" and/or gas flow fluctuations generated by the stagnation of the precursor gases during substrate transfer or chamber processing idle times and the variable flow often created by the process recipe or normal cyclic variation created by the repetitive sequential substrate processing in the process chamber. Therefore, to solve these common problems found when delivering a multi-component precursor gas, embodiments of the disclosure provided herein may provide a multi-component precursor gas delivery assembly that is able to reliably form the multiple chemical element containing deposited film. In one example, the multiple chemical element containing deposited film is an IGZO containing layer.

FIG. 4 is a schematic illustration of one configuration of the gas source assembly 304 that includes a precursor delivery system 430, according to an embodiment of the disclosure. The precursor delivery system 430 of the gas source assembly 304 is adapted to deliver a multi-component precursor gas to the processing region 312 of a process chamber 300 to form one or more layers containing multiple chemical elements on a surface of a substrate 340. In one example, the gas source assembly 304 is adapted to deliver a multi-component precursor gas that includes tri-methyl-indium (TMI), tri-methyl-gallium (TMG) and diethylzinc (DEZn) in a desired ratio, and the gas source assembly 305 may be configured to provide an oxygen containing gas, to form an IGZO layer that has a desirable composition and properties on a surface of the substrate 340. In one embodiments, the multi-component precursor gas includes a precursor gas selected from the group consisting of tri-methyl-indium (TMI), tri-methyl-gallium (TMG), diethylzinc (DEZn), tri-ethyl-gallium (TEGa), and di-methyl-zinc (DMZn).

In one embodiment, the gas source assembly 304 may include a precursor delivery system 430, a vent line assembly 420 and a precursor line assembly 410 that are used to reliably deliver a desired amount of a multi-component precursor gas to the processing region 312. The precursor delivery system 430 generally includes a plurality of precursor delivery systems, such as precursor delivery systems 432, 434 and 436, that are each used to deliver a type of precursor gas to the inlet line 304A, and thus deliver a multi-component precursor gas to the processing region 312. The precursor delivery systems 432, 434 and 436 each generally include a vapor delivering source assembly 440 (e.g., source assemblies 440A-C), a push gas assembly 450 (e.g., push gas assemblies 450A-C), a back pressure regulator 455 (e.g., back pressure regulators 455A-C), output valves 456A-B, 457A-B, 458A-B and an ampoule (e.g., ampoules 433A, 435A or 437A). While FIG. 4 Illustrates a configuration in which the precursor delivery system 430 is coupled to the precursor plenum 319A, this configuration is not intended to be limiting as to the scope of the disclosure described herein, since the precursor delivery system 430 could be coupled to the precursor plenum 319B instead of the precursor plenum 319A, and the precursor plenum 319A could be configured to deliver the second precursor gas, which is discussed above.

The vapor delivering source assemblies 440A, 440B and 440C each generally include a gas source 441A, 441B, 441C and a flow controller 442A, 442B, 442C that are each configured to deliver a desired flow of gas to the ampoules 433A, 435A or 437A, respectively, to cause a vapor generated from the solid/liquid precursor material 433B, 435B, 437B to flow into a vapor delivery line 443A, 443B and 443C. In some configurations the solid/liquid precursor material 433B, 435B, 437B in the ampoules 433A, 435A or 437A may be maintained at a desirable temperature by a thermal control assembly 438A, 438B, 438C (e.g., thermal blanket, closed-loop chilled fluid supply, etc.). The flow controller 442A, 442B, 442C may include a mass flow controller (MFC) that is able to control the amount of gas flow into the vapor delivery line 443A, 443B and 443C, respectively, based on a pressure set by the back pressure regulators 455A-C. In some configurations, the gas sources 441A, 441B, 441C are each configured to provide one or more carrier gases to its respective flow controller 442A, 442B, 442C and an inner volume of the ampoule 433A, 435A, 437A. In one example, the gas source 441A is configured to simultaneously provide two carrier gases to the inner volume of the ampoule, such as a gas containing nitrogen ($N_2$) and argon (Ar). It is believed that the delivery of an nitrogen and inert gas (e.g., argon gas) mixture will be useful in the formation of an IGZO layer using a PECVD process, due to the presence of these different mass gases that will interact with and bombard the substrate surface during the IGZO deposition process.

The push gas assemblies 450A, 450B, and 450C each generally include a gas source 451A, 451B, 451C and a flow controller 452A, 452B, 452C that are configured to deliver a desired flow of gas to the vapor delivery lines 443A, 443B and 443C, respectively, to push the vapor generated from the solid/liquid precursor material 433B, 435B, 437B through the back pressure regulators 455A-C and into either the precursor line assembly 410 or the vent line assembly 420. The flow controller 452A, 452B, 452C may include a mass flow controller (MFC) that is able to control the amount of gas flow into the vapor delivery line 443A, 443B and 443C, respectively, based on a pressure set by the back pressure regulators 455A-C. In some configurations, the gas sources 451A, 451B, 451C are each configured to provide one or more carrier gases to its respective flow controller 452A, 452B, 452C and vapor delivery line 443A, 443B and 443C. In one example, the gas source 451A is configured to simultaneously provide two carrier gases to the inner volume of the ampoule, such as a gas containing nitrogen ($N_2$) and argon (Ar).

The precursor line assembly 410 is coupled to the inlet line 304A which is connected to the precursor plenum 319A of the gas distribution plate assembly 318. The precursor line assembly 410 is adapted to receive one or more of the precursor gases from each of the precursor delivery systems 432, 434 and 436 at one or more times during a deposition process performed in the process chamber 300. The precursor line assembly 410 may include a gas source 413 and a flow controller 412 that is configured to deliver a desired flow of gas through the inlet line 304A to cause a precursor vapor injected into the line from each of the precursor delivery systems 432, 434 and 436 to flow into inlet line 304A and into the processing region 312 through the precursor plenum 319A and gas conduits 323. The flow controller 412 within the gas source 413 may include an MFC that is able to control the amount of gas flow within the inlet line 304A at a desired rate. In some configurations, the gas source 413 is configured to provide one or more carrier gases to the flow controller 412 and inlet line 304A. In one example, the gas source 413 is configured to simultaneously provide two carrier gases to the inner volume of the flow controller 412, such as a gas containing nitrogen ($N_2$) and argon (Ar). In some configurations, the flow controller 412 is configured to deliver a constant, or minimally varying flow, of the one or more carrier gases through the inlet line 304A.

The vent line assembly 420 is coupled to the exhaust line 307A that is connected to the exhaust pump 307. The vent line 421 is also adapted to receive one or more of the precursor gases from each of the precursor delivery systems 432, 434 and 436 at one or more times during a deposition process performed in the process chamber 300. The vent line assembly 420 may include a gas source 423 and a flow controller 422 that is configured to deliver a desired flow of gas to the exhaust line 307A to allow a vapor injected within the line from each of the precursor delivery systems 432, 434 and 436 to flow into exhaust line 307A and then be exhausted from the process chamber 300. The flow controller 422 may include an MFC that is able to control the amount of gas flow within the exhaust line 307A. In some configurations, the gas source 423 is configured to provide one or more carrier gases to the flow controller 422 and exhaust line 307A at a desired rate. In one example, the gas source 423 is configured to simultaneously provide two carrier gases to the inner volume of the flow controller 422, such as a gas containing nitrogen ($N_2$) and argon (Ar). In some configurations, the flow controller 422 is configured to deliver a constant, or minimally varying flow, of the one or more carrier gases through the vent line 421.

During operation, and based on software instructions contained within the memory 294 of the system controller 290, the system controller 290 is configured to command the components in the precursor delivery system 430 to deliver a desired mixture of the vaporized solid/liquid precursor material 433B, 435B, 437B to form a multi-element containing layer on a surface of the substrate 340 that is disposed in the processing region 312 of the process chamber 300. Due to the differing vapor and/or sublimation rates of the solid/liquid precursor material 433B, 435B, 437B used to form a multi-component precursor gas, the system controller 290 will generally deliver control signals to the flow controllers 442A, 442B and 442C and the flow controllers 452A, 452B and 452C to cause a desired flow rate of each type of precursor gas to flow through their respective vapor delivery line 443A, 443B or 443C, their respective back pressure regulator 455A, 455B and 455C and into the inlet line 304A so that they mix and are then delivered to processing region 312. Based on the vaporization rate of each solid/liquid precursor material 433B, 435B, 437B the desired gas flow rates form each precursor delivery systems 432, 434 and 436 is set so that a desired mass flow rate for each precursor gas is reached to form a multi-component precursor gas that has a desired composition. In one example, the flow rates for tri-methyl-indium (TMI), tri-methyl-gallium (TMG) and diethylzinc (DEZn) have a ratio of 80:1:10, respectively, while the inner volume of the ampoules are maintained at a pressure of about 760 Torr, to form a multi-component precursor gas that can form an IGZO layer having a In:Ga:Zn composition ratio of about 1:1:1. The back pressure regulators 455A, 455B and 455C are typically set so that the flow provided by each precursor delivery systems 432, 434 and 436 is at a desired rate. In one example, the back pressure regulators 455A, 455B and 455C are set to the same pressure level so that the generated precursor gases can be combined within the inlet line 304A and/or the precursor plenum 319A in stable and minimally varying way, even when scheduled and unscheduled multi-component precursor gas flows and process chamber pressure variations, which are upstream of the back pressure regulators 455A, 455B and 455C, occur.

Moreover, to avoid the fluctuations in the flow of the multi-component precursor gas, and possibly the composition of the multi-component precursor gas, due to the stopping and starting of the precursor gas flow during process chamber idle or other similar times, the precursor gases delivered through the vapor delivery lines 443A, 443B or 443C is maintained at a desired flow rate, but is diverted through the output valves 456A, 457A, 458A and into the vent line 421 when the chamber is not ready to receive the multi-component precursor gas. In some cases, the flow rate provided by the flow controllers 442A, 442B and 442C and flow controllers 452A, 452B and 452C is reduced while the precursor gases are delivered into the vent line 421 and into the exhaust pump 307. Next, when the multi-component precursor gas is to be delivered to the processing region 312 the output valves 456A, 457A, 458A are closed and the output valves 456B, 457B, 458B are opened to allow the precursor gases to be delivered into processing region 312 through the inlet line 304A. In some embodiments, the flow of each of the precursor gases by each precursor delivery systems 432, 434 or 436 are never stopped, and thus the problems associated with the stopping and starting of the precursor gas flow will not occur. In one configuration, the time between first delivering the precursor gas flow to the vent line 421 and then to the inlet line 304A, and vice versa, is minimized and is in some cases nonexistent (e.g., switched directly from one state to the other). One will appreciate that this problem is additionally complex, due to the need to separately control a plurality of separate precursor delivery systems whose outputs are fluidly coupled together, and thus a fluctuation in one output will affect the output of the others.

In some embodiments of the precursor delivery system 430, a differential pressure control system 460 is used to control the variation in pressure between the inlet line 304A and vent line 421 to further minimize the variability in the multi-component precursor gas flow to the processing region 312 from the inlet line 304A. In this configuration, the differential pressure control system 460 is able to adjust and maintain a set differential pressure between the inlet line 304A and vent line 421, by use of one or more back pressure regulator controllers (not shown) that is communication with the vent line 421. The back pressure regulator controller is typically configured to control the pressure differential between the vent line 421 and inlet line 304A by allowing an amount of gas to flow from the inlet line 304A to the vent line 421 as needed to maintain the desired pressure differential. Therefore, during the operation of the process chamber 300, when the pressure within the processing region 312, exhaust pump 307 and/or exhaust line 307A vary due to normal or unscheduled pressure variations, the flow variation in the multiple component precursor gas flow into the inlet line 304A can be minimized.

In one embodiment, the precursor delivery system 430 may include at least one precursor delivery system (not shown), which is similar to the precursor delivery systems 432, 434 or 436 described above, that is adapted to provide a precursor gas to form one or more additional layers on a layer that is formed by the formation and delivery of the multi-component precursor gas to the surface of the substrate, as discussed above. In one example, a process performed in the chamber 300 may include the formation of an IGZO layer as discussed above, and then a second layer, such as aluminum oxide ($Al_2O_3$) is formed thereon by use of one or more of the components found in the precursor delivery system 430. The precursor delivery system 430 may thus additionally include one or more additional precursor delivery systems that are each used to deliver a type of precursor gas to the inlet line 304A. The additional precursor delivery systems will also each generally include a vapor delivering source assembly 440, a push gas assembly 450, a back pressure regulator 455, output valves 456A, 457A, 458A, and an ampoule, as discussed above. In one example, the precursor delivery system 430 is configured to deliver an indium containing precursor gas (e.g., tri-methyl-indium (TMI)) from a first precursor delivery system 432, a gallium containing precursor gas (e.g., tri-methyl-gallium (TMG), tri-ethyl-gallium (TEGa)) from a second precursor delivery system 434, a zinc containing precursor gas (e.g., diethylzinc (DEZn), di-methyl-zinc (DMZn)) from a third precursor delivery system 436, and an aluminum containing precursor gas (tri-methyl-aluminum (TMA)) from a fourth precursor delivery system (not shown) to processing region 312 through the inlet line 304A or into the exhaust line 307A.

Although several preferred embodiments which incorporate the teachings of the present disclosure have been shown and described in detail, those skilled in the art can readily devise many other varied embodiments that still incorporate these teachings.

What is claimed is:
1. A system for forming a multi-element containing film, comprising:
 a gas distribution plate assembly comprising a first precursor plenum, a second precursor plenum and a heat exchanging channel formed in a body of the gas distribution plate assembly;
 a plurality of first gas conduits extending from the first precursor plenum through the heat exchanging channel, wherein each of the plurality of first gas conduits are in fluid communication with the first plenum and a processing region of a first process chamber;
 a plurality of second gas conduits extending from the second precursor plenum through the heat exchanging channel and the first precursor plenum, wherein each of the plurality of second gas conduits are in fluid communication with the second plenum and the processing region;
 an exhaust line that is disposed between and is in fluid communication with an exhaust pump and the processing region;
 a precursor line assembly that is in fluid communication with the first precursor plenum or the second precursor plenum;
 a vent line assembly that is in fluid communication with the exhaust line; and
 a plurality of precursor delivery systems that each comprise:
  an ampoule having an inlet and an outlet, wherein an inner volume of the ampoule is configured to receive a precursor material and is in fluid communication with the inlet and the outlet;

a vapor delivering source assembly that is configured to deliver a first gas to the inlet and inner volume of the ampoule; and a back pressure regulator that has an upstream side that is in fluid communication with the outlet of the ampoule and a downstream side that is fluid communication with either the precursor line assembly or the vent line assembly.

2. The system of claim 1, wherein the precursor line assembly further comprises an inlet line and a first gas source that is configured to deliver a gas to the first precursor plenum or the second precursor plenum through the inlet line, and the vent line assembly further comprises a vent line and a second gas source that is configured to deliver a gas to the exhaust line through the vent line, wherein the downstream side of each of the back pressure regulators in the plurality of precursor delivery systems is in selective fluid communication with the inlet line and the vent line.

3. The system of claim 2, further comprising:

a differential pressure control system that is configured to control a pressure difference formed between the inlet line and the vent line.

4. The system of claim 1, further comprising:

a power source that is configured to provide an RF bias to the gas distribution plate assembly.

5. The system of claim 1, wherein the plurality of precursor delivery systems comprise:

a first ampoule, wherein an inner volume of the first ampoule includes a precursor material that comprises tri-methyl-indium (TMI);

a second ampoule, wherein an inner volume of the second ampoule includes a precursor material that comprises tri-methyl-gallium (TMG) or tri-ethyl-gallium (TEGa); and a third ampoule, wherein an inner volume of the third ampoule includes a precursor material that comprises diethylzinc (DEZn) or di-methyl-zinc (DMZn).

6. The system of claim 1, further comprising:

a second process chamber, comprising:
a gas distribution plate assembly; and
a precursor precursor delivery system comprises a precursor gas source that is configured to deliver a silicon containing precursor; and a transfer chamber having a robot that is configured to transfer a substrate between the first process chamber and the second process chamber.

7. The system of claim 1, wherein the plurality of precursor delivery systems comprise:

a first ampoule, wherein an inner volume of the first ampoule includes a precursor material that comprises tri-methyl-indium (TMI);

a second ampoule, wherein an inner volume of the second ampoule includes a precursor material that comprises tri-methyl-gallium (TMG) or tri-ethyl-gallium (TEGa);

a third ampoule, wherein an inner volume of the third ampoule includes a precursor material that comprises diethylzinc (DEZn) or di-methyl-zinc (DMZn); and a fourth ampoule, wherein an inner volume of the fourth ampoule includes a precursor material that comprises tri-methyl-aluminum (TMA).

8. A method of forming a multi-element containing film, comprising:

flowing a first multi-component precursor gas through a first plenum of a gas distribution plate assembly and into a processing region of a first process chamber for a first period of time and a second period of time, wherein the first plenum is fluidly coupled to the processing region through a plurality of first gas conduits, and the first multi-component precursor gas is formed by mixing a first precursor gas and a second precursor gas in the first plenum or a precursor delivery line that is coupled to the first plenum;

flowing a second multi-component precursor gas into a vent line assembly for a third period of time, wherein the second multi-component precursor gas is formed by mixing the first precursor gas and the second precursor gas, and the vent line assembly is fluidly coupled to an exhaust line that is disposed between and in fluid communication with the processing region and an exhaust pump; and introducing a heat exchanging fluid to a heat exchanging channel, wherein the plurality of first gas conduits extend through the heat exchanging channel, wherein flowing a second multi-component precursor gas into a vent line assembly for the third period of time is performed after flowing the first multi-component precursor gas through the first plenum for the first period of time and before flowing the first multi-component precursor gas through the first plenum for the second period of time.

9. The method of claim 8, wherein the first precursor gas comprises tri-methyl-indium (TMI) and the second precursor gas comprises tri-methyl-gallium (TMG), tri-ethyl-gallium (TEGa), di-methyl-zinc (DMZn) or diethylzinc (DEZn).

10. The method of claim 8, wherein the formed first multi-component precursor gas further comprises a third precursor gas, and the first precursor gas comprises tri-methyl-indium (TMI), the second precursor gas comprises tri-methyl-gallium (TMG) or tri-ethyl-gallium (TEGa), and the third precursor gas comprises diethylzinc (DEZn) or di-methyl-zinc (DMZn).

11. The method of claim 10, further comprising flowing an oxygen containing gas through a second plenum of the gas distribution plate assembly and into the processing region of the first process chamber during the first period of time and the second period of time, wherein the second plenum is fluidly coupled to the processing region through a plurality of second gas conduits.

12. The method of claim 8, further comprising flowing an oxygen containing gas through a second plenum of the gas distribution plate assembly and into the processing region of the first process chamber during the first period of time and the second period of time, wherein the second plenum is fluidly coupled to the processing region through a plurality of second gas conduits.

13. The method of claim 8, further comprising delivering a cleaning gas to the processing region of the first process chamber during the third period of time.

14. The method of claim 8, further comprising:

flowing an oxygen containing gas through a second plenum of the gas distribution plate assembly and into the processing region of the first process chamber during the first period of time and the second period of time, wherein the second plenum is fluidly coupled to the processing region through a plurality of second gas conduits; and delivering a cleaning gas to the processing region of the first process chamber during the third period of time, wherein the cleaning gas is delivered to the processing region through the first plenum or the second plenum.

15. The method of claim 14, wherein delivering the cleaning gas to the processing region further comprises generating a plasma containing the cleaning gas, and then delivering the cleaning gas to the processing region of the first process chamber during the third period of time.

16. The method of claim 8, further comprising:
forming a silicon containing layer on the surface of the substrate by delivering a silicon containing precursor to the surface of the substrate when the substrate is disposed in a processing region of a second process chamber, wherein forming the silicon containing layer is performed before the first period of time and the second period of time.

17. The method of claim 8, further comprising:
forming an aluminum oxide containing layer on the surface of the substrate by:
delivering an aluminum containing precursor to the surface of the substrate when the substrate is disposed in the processing region of the first process chamber; and
generating an oxygen containing plasma and delivering the oxygen containing plasma to the processing region of the first process chamber when the substrate is disposed in the processing region of the first process chamber.

18. The method of claim 17, wherein the aluminum containing precursor is tri-methyl-aluminum (TMA).

19. The method of claim 8, further comprising forming a titanium oxide containing layer on the surface of the substrate by:
delivering a titanium containing precursor to the surface of the substrate; and
generating an oxygen containing plasma and delivering the oxygen containing plasma to the processing region of the first process chamber when the substrate is disposed in the processing region of the first process chamber.

20. The method of claim 19, wherein the titanium containing precursor is titanium chloride or tetrakis dimethylamido titanium (TDMA).

* * * * *